(12) United States Patent
Ware

(10) Patent No.: US 9,874,898 B2
(45) Date of Patent: Jan. 23, 2018

(54) MEMORY SYSTEM USING ASYMMETRIC SOURCE-SYNCHRONOUS CLOCKING

(75) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 375 days.

(21) Appl. No.: 14/114,863

(22) PCT Filed: May 8, 2012

(86) PCT No.: PCT/US2012/036861
§ 371 (c)(1),
(2), (4) Date: Oct. 30, 2013

(87) PCT Pub. No.: WO2012/158392
PCT Pub. Date: Nov. 22, 2012

(65) Prior Publication Data
US 2014/0075237 A1    Mar. 13, 2014

(51) Int. Cl.
| | | |
|---|---|---|
| G06F 1/04 | (2006.01) |
| G06F 1/08 | (2006.01) |
| G11C 7/02 | (2006.01) |
| G11C 7/04 | (2006.01) |
| G11C 7/10 | (2006.01) |
| G11C 7/22 | (2006.01) |
| G06F 1/12 | (2006.01) |
| G06F 1/10 | (2006.01) |
| G06F 1/06 | (2006.01) |

(52) U.S. Cl.
CPC ............... *G06F 1/08* (2013.01); *G06F 1/04* (2013.01); *G11C 7/02* (2013.01); *G11C 7/04* (2013.01); *G11C 7/1066* (2013.01); *G11C 7/1093* (2013.01); *G11C 7/222* (2013.01); *G06F 1/06* (2013.01); *G06F 1/10* (2013.01); *G06F 1/12* (2013.01)

(58) Field of Classification Search
None
See application file for complete search history.

(56) References Cited

U.S. PATENT DOCUMENTS 6,209,071 B1 *  3/2001  Barth ................ G06F 13/16
                                         711/105
6,281,728 B1 *  8/2001  Sung ................. G11C 7/22
                                         327/158

(Continued)

OTHER PUBLICATIONS

PCT International Preliminary Report on Patentability dated Nov. 28, 2013 (Chapter I) in International Application No. PCT/US2012/036861. 5 pages.

*Primary Examiner* — Tanh Nguyen
(74) *Attorney, Agent, or Firm* — Lance Kreisman; Peninsula Patent Group

(57) ABSTRACT

The disclosed embodiments relate to a memory system that generates a multiplied timing signal from a reference timing signal. During operation, the system receives a reference timing signal. Next, the system produces a multiplied timing signal from the reference timing signal by generating a burst comprising multiple timing events for each timing event in the reference timing signal, wherein consecutive timing events in each burst of timing events are separated by a bit time. Then, as the reference clock frequency changes, the interval between bursts of timing events changes while the bit time remains substantially constant.

17 Claims, 16 Drawing Sheets

(56) References Cited

U.S. PATENT DOCUMENTS

| | | | |
|---|---|---|---|
| 7,301,831 B2* | 11/2007 | Ware | G06F 13/1689 |
| | | | 365/191 |
| 7,496,780 B2* | 2/2009 | Abel | H04J 3/04 |
| | | | 370/503 |
| 2002/0040424 A1 | 4/2002 | Kumazawa | |
| 2005/0258883 A1* | 11/2005 | Farjad-rad | G06F 1/04 |
| | | | 327/295 |
| 2007/0217559 A1* | 9/2007 | Stott | G11C 7/1051 |
| | | | 375/355 |
| 2007/0234100 A1 | 10/2007 | Baker et al. | |
| 2009/0109770 A1 | 4/2009 | Sugishita | |
| 2010/0205386 A1 | 8/2010 | Yamashita | |
| 2011/0138215 A1* | 6/2011 | Kojima | H03K 3/011 |
| | | | 713/500 |
| 2013/0033946 A1* | 2/2013 | Ware | G06F 13/1689 |
| | | | 365/193 |
| 2014/0075237 A1* | 3/2014 | Ware | G11C 7/02 |
| | | | 713/501 |
| 2014/0293710 A1* | 10/2014 | Ware | G11C 7/1066 |
| | | | 365/189.02 |

* cited by examiner

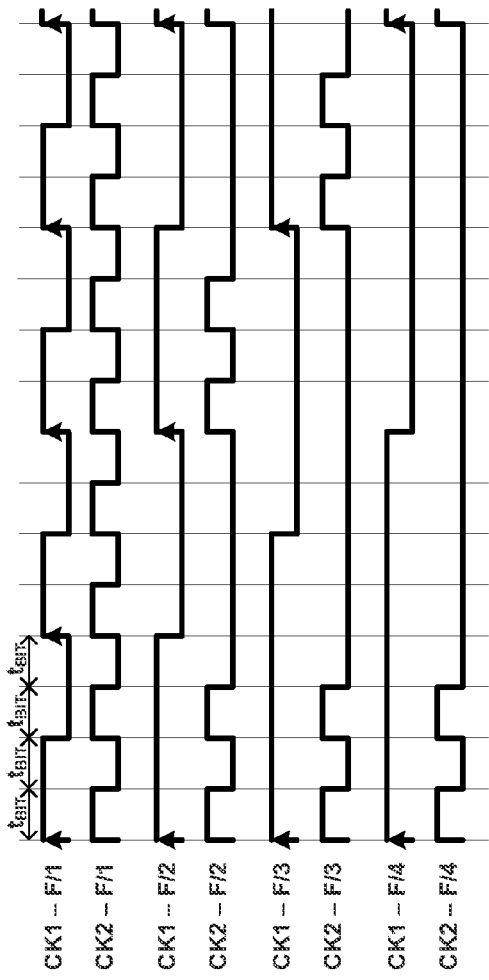
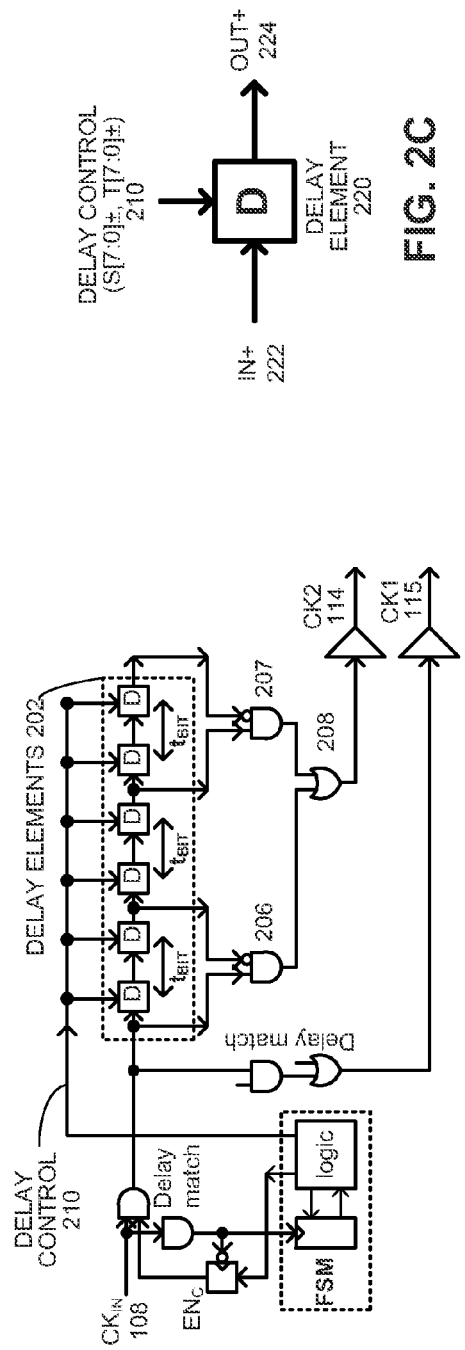
FIG. 2A
FIG. 2B
FIG. 2C

| case | F9 | F8 | F7 | E9 | E8 | E7 | E6 | E5 | E4 | E3 | E2 | E1 | E0 | edge | delay |
|---|---|---|---|---|---|---|---|---|---|---|---|---|---|---|---|
| F/1 | 0 | 0/1 | 1 | 0 | 0 | 0 | 0 | 0 | 0/1 | 1 | 1 | 1 | 1/0 | F8=0/1 | dec/inc |
| F/2 | 1 | 1/0 | 0 | 0 | 0/1 | 1 | 1 | 1 | 1 | 1 | 1 | 1 | 1 | E8=0/1 | dec/inc |
| F/4 | 0 | 0 | 0 | 1 | 1 | 1/0 | 0 | 0 | 0 | 0 | 0 | 0 | 0 | E7=0/1 | inc/dec |
| F/8 | 0 | 0 | 0 | 1 | 1 | 1 | 1 | 1/0 | 0 | 0 | 0 | 0 | 0 | E5=0/1 | inc/dec |
| F/16 | 0 | 0 | 0 | 1 | 1 | 1 | 1 | 1 | 1 | 1 | 1 | 1/0 | 0 | E1=0/1 | inc/dec |
| F/32 | 0 | 0 | 0 | 0 | 0 | 0 | 0 | 0 | 0 | 0 | 0/1 | 1 | 1 | E2=0/1 | dec/inc |
| F/64 | 0 | 0 | 0 | 0 | 0 | 0 | 0 | 0 | 0/1 | 1 | 1 | 1 | 1 | E4=0/1 | dec/inc |

FIG. 4C

# MEMORY SYSTEM USING ASYMMETRIC SOURCE-SYNCHRONOUS CLOCKING

CROSS-REFERENCE TO RELATED APPLICATIONS/TECHNICAL FIELD

Pursuant to 35 U.S.C. §365, this application claims priority from International Application No. PCT/US2012/036861, published as WO 2012/158392 A2 on Nov. 22, 2012, which claims priority from U.S. Provisional Application No. 61/487,221, filed May 17, 2011 and entitled "MEMORY SYSTEM USING ASYMMETRIC SOURCE-SYNCHRONOUS CLOCKING". International Application No. PCT/US2012/036861 and U.S. Provisional Application No. 61/487,221 are hereby incorporated by reference in their entirety.

BACKGROUND

Field

The disclosed embodiments generally relate to clocked memory systems. More specifically, the disclosed embodiments relate to a memory system that uses asymmetric, source-synchronous clocking to facilitate changing a clock frequency without producing gaps in memory traffic.

Related Art

Memory systems in portable computing devices typically operate at reduced clock speeds when computational workloads are low. These reduced clock speeds enable the supply voltage to be reduced at the memory controller, which decreases power consumption and thereby extends battery life. However, dealing with these changing clock speeds can complicate the design of modern high-performance memory systems.

To increase bandwidth, memory systems can potentially distribute a reference clock and can perform rate multiplication to generate a higher frequency synchronized clock from the reference clock. This reference timing signal can potentially be multiplied using a conventional phase-locked loop (PLL) or a delay-locked loop (DLL). Unfortunately, PLLs and DLLs burn a significant amount of power, which makes them undesirable in portable computing devices, which have limited battery capacity. Moreover, when the reference clock frequency changes, the PLLs and DLLs need to be recalibrated, which can also impede system performance.

Hence, what is needed is a method and an apparatus for generating a multiplied timing signal without the above-described drawbacks of using a PLL or a DLL.

BRIEF DESCRIPTION OF THE FIGURES

FIG. 2A presents a timing diagram illustrating how different reference timing signals are multiplied in accordance with the disclosed embodiments.

FIG. 2B illustrates a circuit which generates a burst of timing events in accordance with the disclosed embodiments.

FIG. 2C illustrates a programmable delay element in accordance with the disclosed embodiments.

FIG. 4C presents a table illustrating how delay elements are adjusted in accordance with the disclosed embodiments.

DETAILED DESCRIPTION

The disclosed embodiments relate the design of an asymmetric, source-synchronous clocking system for a clocked memory that facilitates changing a clock frequency without producing gaps in memory traffic. This clocking system generates a multiplied timing signal from a reference timing signal by generating a "burst" comprising multiple timing events for each timing event in the reference timing signal. (A "timing event" can be defined as a change in the timing signal, such as a rising clock edge or a falling clock edge.) For example, each rising edge in the reference timing signal can generate a burst comprising two complete clock cycles in the multiplied timing signal, wherein each complete clock cycle includes a rising edge which constitutes a timing event. In this case, the timing events in a given burst are separated by a bit time, and this bit time does not substantially change when the frequency of the reference timing signal changes. Note that, instead of the bit timing changing, the interval between bursts of timing events changes as the reference clock frequency changes.

The disclosed embodiments may optionally be applied to memory systems for portable devices, where an operating system environment of the portable device dynamically changes clock speed with little or no advance notice. As mentioned previously, in such systems, frequency limitations associated with clock distribution may restrict the bandwidth that can be used for intra-chip or intra-system signaling. Moreover, using a clock multiplier at a destination of a distributed clock can facilitate driving higher bandwidths without suffering from the practical limits in clock distribution frequency. By generating the multiplied clocks in a manner that keeps the bit times substantially constant, the delay between timing events does not significantly change as the frequency of the reference timing signal changes. As a consequence, the bit time can be calibrated at any reference frequency and the calibration will remain valid as the reference frequency changes. This makes it possible to calibrate the bit time without stopping ongoing memory operations.

However, as the reference frequency changes, the interval between bursts of timing events changes, and this change may lead to a slight increase in ISI. To compensate for this increase in ISI, some of the disclosed embodiments nominally increase the bit time when the frequency of the reference timing signal decreases. These embodiments are described in more detail below with reference to FIGS. 5A-5B.

Memory System

Figure 1:
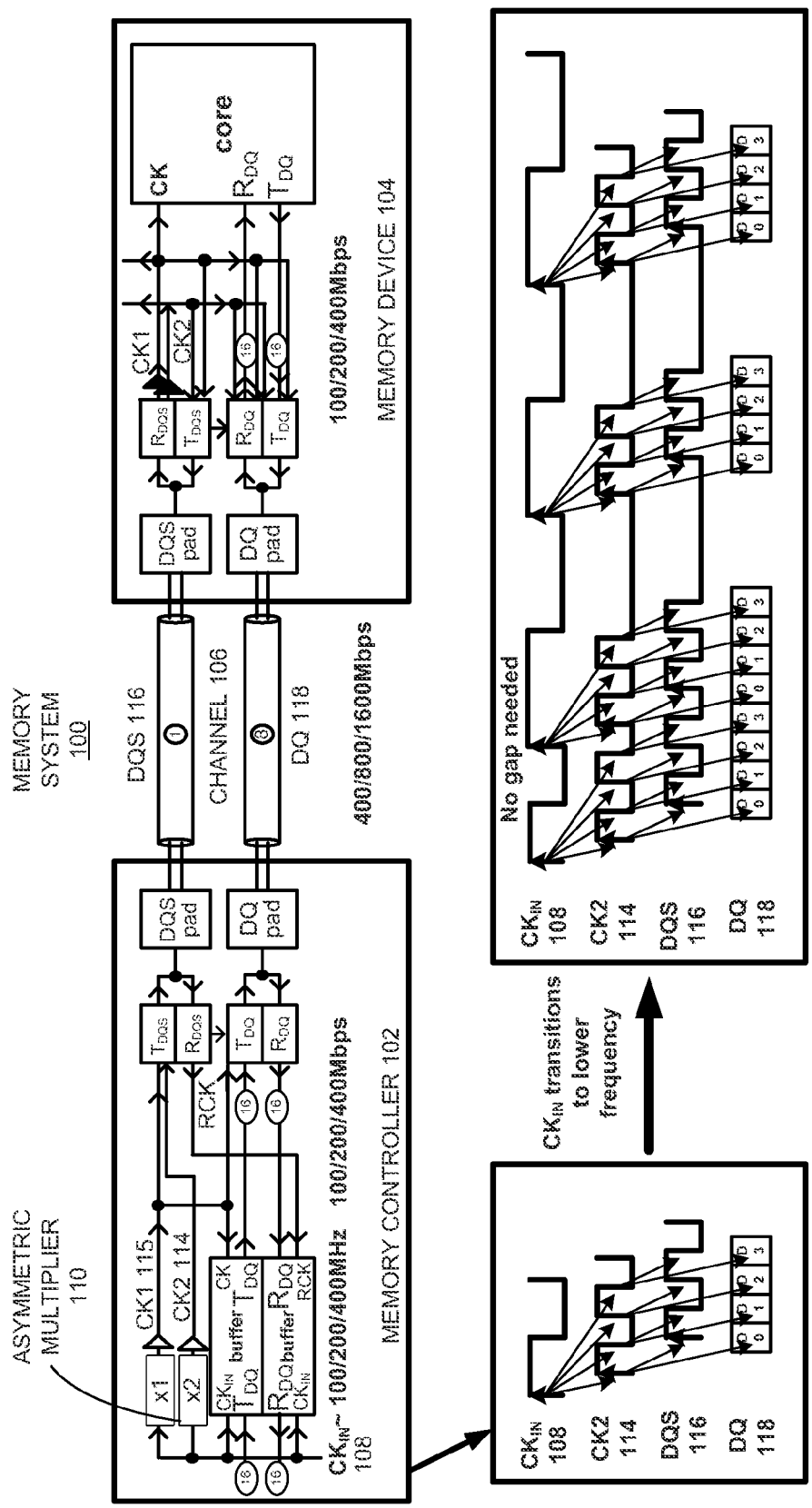
FIG. 1 illustrates an asymmetric clock multiplier for a memory system in accordance with the disclosed embodiments.

FIG. 1 illustrates an exemplary memory system 100 that uses asymmetric clocking Memory system 100 includes a memory controller 102 which is coupled to a memory device 104. Memory controller 102 receives a reference timing signal $CK_{IN}$ 108 and uses an asymmetric multiplier circuit 110 to produce a multiplied timing signal which feeds across a DQS signal line 116 in channel 106 to memory device 104. Note that channel 106 also carries DQ signals 118. Each of the memory controller and the memory device are optionally embodied as dedicated integrated circuit devices, with the memory device optionally being a discrete random access memory ("DRAM") integrated circuit device.

As illustrated in the timing diagram in the lower left-hand portion of FIG. 1, each rising edge in $CK_{IN}$ 108 generates a burst containing two full clock cycles in CK2 signal 114. Note that CK2 signal 114 is routed into DQS signal line 116, which feeds across channel 106 and is used to clock DQ signals 118. As illustrated in the timing diagram in the lower right-hand corner of FIG. 1, when $CK_{IN}$ 108 transitions to a lower frequency, each rising edge in $CK_{IN}$ 108 still generates a burst containing two full clock cycles in CK2 signal 114, However, the bursts become separated by larger time intervals.

As also illustrated in FIG. 1, the memory controller transmits CK2 to the memory device, which the memory device divides down to regenerate CK1. The memory device then uses CK1 for timing of its core operations. That is to say, memory device times its own internal operations using a version of asymmetric clock CK1, regenerated from CK2. The memory device also uses CK2 to generate a controller-bound strobe signal, which the memory device transmits to the memory controller in a manner that is source-synchronous with read data. The controller uses this strobe from the memory device to time the sampling of data from the memory device. In one embodiment, read data is transmitted using a serial, differential signal, with the controller deriving both a timing signal for a sampler and a word framing signal from the strobe from the memory device. Note that because the asymmetric multiplier circuit 110 always generates the same number of transitions in CK2 irrespective of variation in rate of CK1, a change in underlying clock frequency does not affect framing boundaries for serially transmitted data words. In the embodiment seen in FIG. 1, the strobe path is bidirectional, that is, write data is accompanied by a source synchronous strobe from the memory controller (based on CK2 signal 114) over DQS signal line 116, and read data is accompanied by a source synchronous strobe from the memory device over the DQS signal line 116, traveling in the opposite direction.

As noted in FIG. 1, the DQ path can further comprise multiple signal lanes, with transmission between memory controller and memory device being in parallel or using a combination of serial and parallel transmission. When parallel communications are used, the controller advantageously includes per lane deskew circuitry as part of its transmit ($T_{DQ}$) and receive ($R_{DQ}$) circuits, to align each signal lane to a common phase of DQS signal 116.

Clock Multiplication Circuitry

FIG. 2A presents a timing diagram illustrating an un-multiplied timing signal CK1 and a multiplied timing signal CK2 for a number of different reference clock frequencies (F/1, F/2, F/3 and F/4) in accordance with the disclosed embodiments. Each rising edge in the un-multiplied timing signal generates a burst comprising two full clock cycles in the multiplied timing signal, with each clock cycle in the multiplied timing signal being equivalent to two bit intervals "$t_{BIT}$." Note that as the reference clock frequency decreases, the bursts are spaced farther apart.

An exemplary circuit that generates bursts for each rising edge in the reference timing signal is illustrated in FIG. 2B. In this circuit, a reference timing signal $CK_{IN}$ 108 feeds through a chain of delay elements 202, wherein the delay through two consecutive delay elements is a bit time $t_{BIT}$. Outputs from some of the delay elements pass through a number of logic gates 206-208 to produce multiplied CK2 signal 114. The delay through each of the delay elements in the chain can be adjusted by adjusting delay control signals 210. Note that the un-multiplied clock signal, CK1 signal 115, is adjusted by delay match elements so as to match delays introduced by logic gates 206-208.

FIG. 2C illustrates an exemplary delay element 220 which receives an input signal IN+ 222 and produces a delayed output signal OUT+ 224. Note that delay element 220 receives 16 delay control signals S[7:0] and T[7:0] which are used to adjust the delay through delay element 220 as is described in more detail below with reference to FIG. 10. Also note that each delay element 220 provides a delay of one-half of a bit interval $t_{BIT}/2$.

Calibration Circuitry

Figures 3A, 3B:
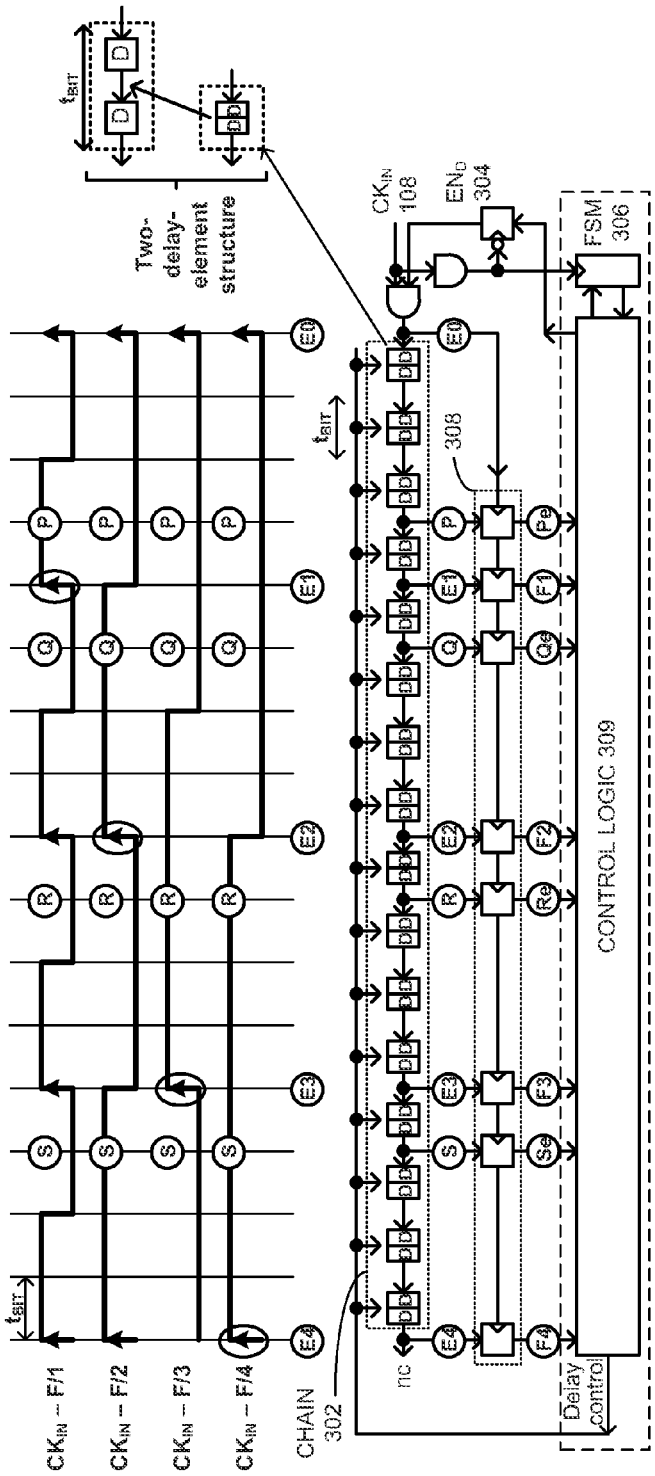
FIG. 3A illustrates a circuit that facilitates calibrating delay elements in accordance with the disclosed embodiments.
FIG. 3B presents a table illustrating how delay elements are adjusted in accordance with the disclosed embodiments.

Delay element 220 can be calibrated to compensate for "drift" while the memory system is operating by using the circuitry illustrated in FIG. 3A. This drift can arise from a number of factors including changes in temperature or operating voltage. The circuitry illustrated in FIG. 3A is designed to calibrate the delay elements at a number of different clock frequencies for reference timing signal $CK_{IN}$ 108, namely F/1, F/2, F/3 and F/4. During operation, the reference timing signal $CK_{IN}$ 108 feeds through a delay chain 302 comprising pairs of delay elements, with all of the delay elements being substantially identical in design (and therefore corresponding to substantially identical time delay). An enable signal $EN_D$ 304 (generated by a finite state machine (FSM) 306) controls the feeding of reference timing signal $CK_{IN}$ 108 into delay chain 302. During operation of the calibration circuitry, as a first rising edge in reference timing signal $CK_{IN}$ 108 passes through delay chain 302, a second rising edge in reference timing signal $CK_{IN}$ 108 causes a set of latches 308 to take snapshot of the signal in delay chain 302; each latch in the set of latches 308 transfers its input to its output on a rising edge of its input clock.

A number of these latches 308 store values Se, Re, Qe and Pe, based on their specific locations in delay chain 302; these values enable control logic 309 to determine which of four clock frequencies (F/1, F/2, F/3 or F/4) reference timing signal $CK_{IN}$ 108 is operating at. The timing diagram which appears in the top portion of FIG. 3A illustrates how each of the frequencies F/1, F/2, F/3 and F/4 produces a different pattern of values for signals Se, Re, Qe and Pe.

Other latches in the set of latches 308 capture timing information for edge transitions associated with different reference clock frequencies, namely E1, E2, E3 and E4. In particular, E1 is associated with a rising edge for reference frequency F/1, E2 is associated with a rising edge for reference frequency F/2, E3 is associated with a rising edge for reference frequency F/3, and E4 is associated with a rising edge for reference frequency F/4. The table in FIG. 3B illustrates how the delay through each of the delay elements is incremented or decremented based on the observed values for Se, Re, Qe and Pe for each of the possible reference clock frequencies. Note that the 16-bit delay control value S[7:0], T[7:0] for the delay elements can be incremented or decremented by one LSB (least-significant bit) by finite state machine (FSM) 306.

Figure 4A:
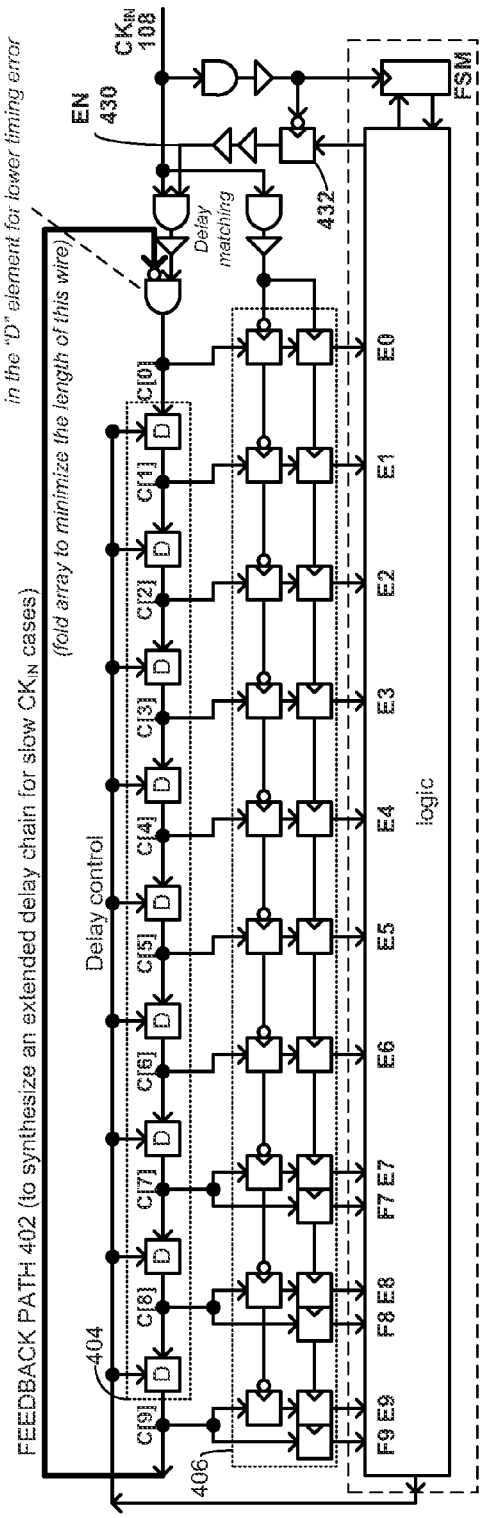
FIG. 4A illustrates another circuit that facilitates calibrating delay elements in accordance with the disclosed embodiments.

The circuitry illustrated in FIG. 3A can be extended to operate with a wider range of reference clock frequencies, for example F/1, F/2, F/4, F/8, F/16, F/32 and F/64. However, as the range of frequencies gets larger, so too does the supporting circuitry. To reduce the required amount of supporting circuitry, an alternate embodiment (illustrated in FIG. 4A) provides a feedback path 402 that permits a given amount of circuitry to support an extended range of frequencies. As illustrated in FIG. 4A, feedback path 402 effectively extends the size of the delay chain by allowing a clock transition to propagate through the chain of delay elements 404 multiple times before a snapshot of the reference timing signal is taken by latches 406. Note that the set of latches 406 contains two layers of latches for the signals E0, . . . , E9, and these two layers of latches are activated by different clock edges.

Figure 4B:
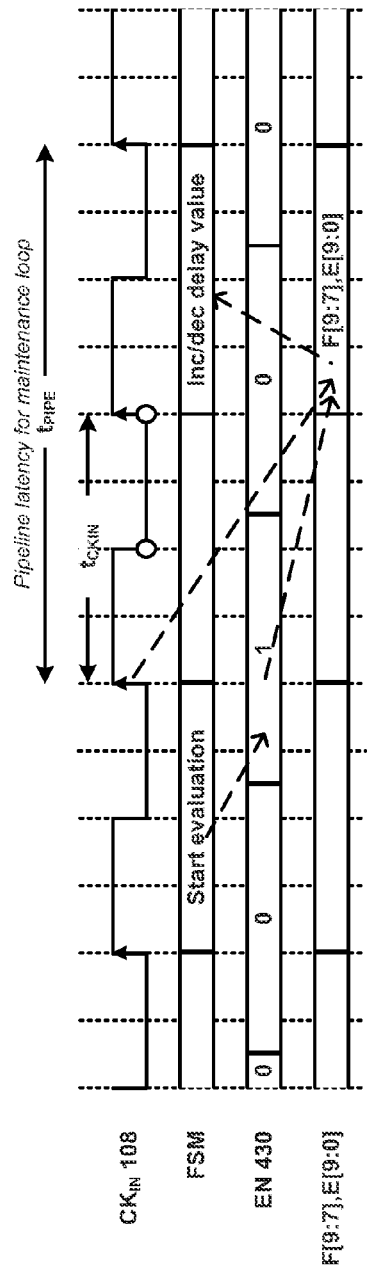
FIG. 4B presents a timing diagram of the delay adjustment process in accordance with the disclosed embodiments.

FIG. 4B illustrates the timing of signals E0, . . . , E9 and F7, . . . F9 relative to the reference timing signal $CK_{IN}$ 108. (The dashed lines in FIG. 4B represent timing markers.) Note that signals F7, . . . , F9 are captured on a rising edge of $CK_{IN}$ signal 108, whereas signals E0, . . . , E9 are captured on a preceding falling edge of $CK_{IN}$ signal 108 in the upper row in latches 406 and are subsequently outputted from latches 406 on the following rising edge of $CK_{IN}$ signal 108. Also note that the timing relationships shown in FIG. 4B will remain approximately constant as $CK_{IN}$ 108 is scaled over a 64:1 frequency range. FIG. 4B also indicates when the increment and decrement signals are generated for the delay elements. The feedback loop latency is very fast so the delay control value can be updated every 2-4 cycles of $CK_{IN}$ 108. In contrast, FIG. 4C presents an associated table which shows how the delay elements are adjusted based on the latched values for each of the possible reference clock frequencies. Note that FIG. 4C is analogous to FIG. 3B, and it show how the 13 sampled signals (F9:F7 and E9:E0) determine both the current operating frequency and whether the delay value should be incremented or decremented. The "0/1" entries in the table in FIG. 4B indicate that the latched value is indeterminate because of a rising edge transition, and the "1/0" entries indicate that the latched value is indeterminate because of a falling edge transition.

Figure 4D:
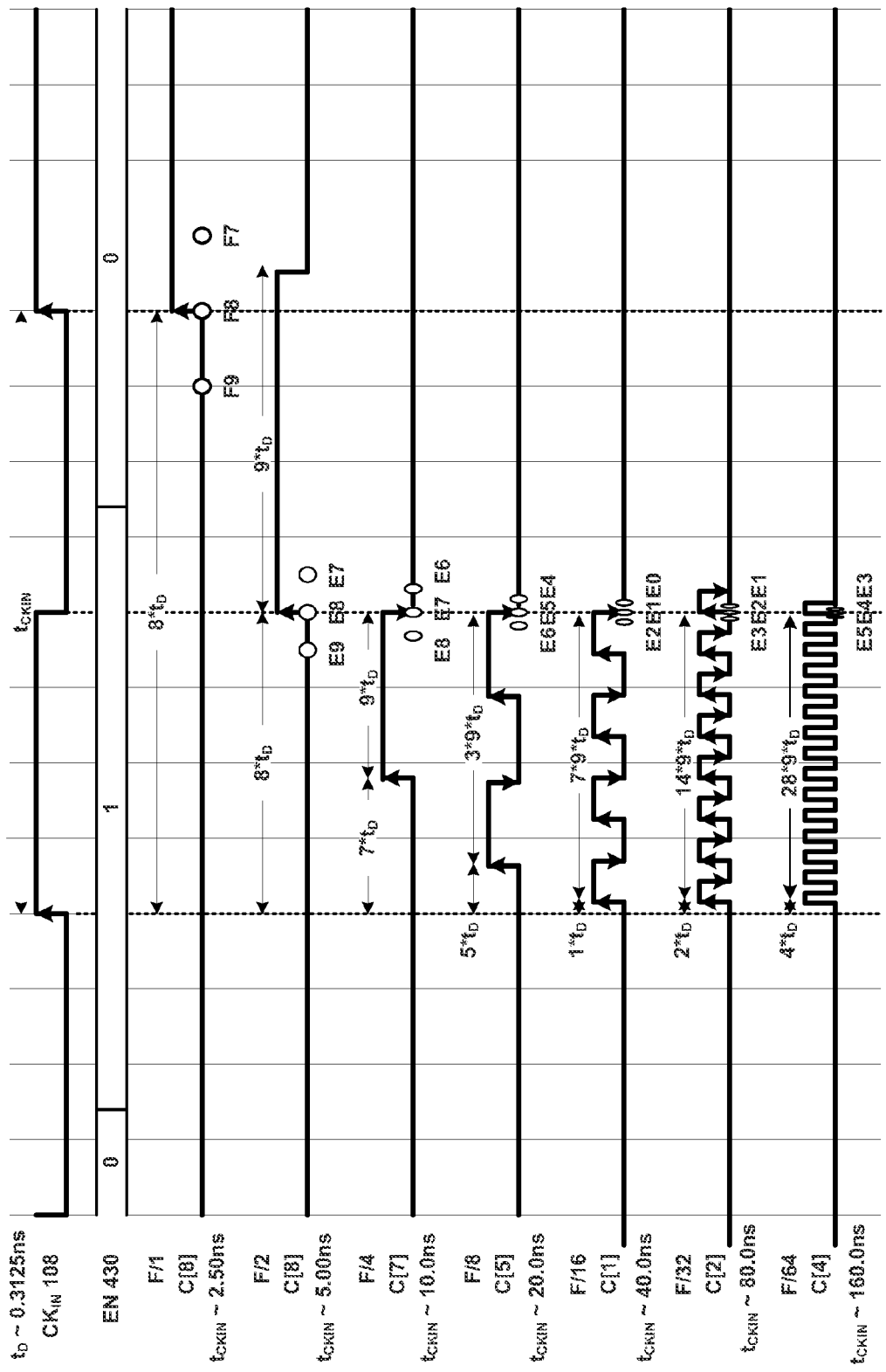
FIG. 4D presents a timing diagram of the delay adjustment process for different reference clock speeds in accordance with the disclosed embodiments.

Finally, FIG. 4D illustrates how the signals E0, . . . , E9 and signals F7, . . . F9 are associated with rising and falling clock edges for different reference clock frequencies F/1, F/2, F/4, F/8, F/16, F/32 and F/64. Note that FIG. 4D is drawn as if $t_{CKIN}$ is constant and the $t_D$ delay value becomes smaller. In fact, $t_{CKIN}$ will scale over a range of 64:1 and the $t_D$ delay value of the delay element will remain approximately constant. FIG. 4D is drawn with $t_{CKIN}$ constant to see the repeated looping of the $CK_{IN}$ signal 108 through the delay chain once the enable signal EN 430 is asserted. For example, in the F/8 case, EN 430 is asserted high, and the next rising edge of $CK_{IN}$ 108 propagates through the delay chain to the C[5] point. The signal continues to the end of the delay chain and is inverted and propagates through the chain to become a falling edge at C[5] a time $9*t_D$ later. This process is repeated two more times, so that a characteristic pattern of 1's and 0's may be sampled on the E0, . . . , E9 and F7, . . . F9 signals at the falling edge of $t_{CKIN}$ (including the E5 signal which contains the increment/decrement indication). Note that the length of the loop was chosen to be $9*t_D$ so that the set of reference clock frequencies F/1, F/2,F/4, F/8, F/16, F/32 and F/64 would each give a unique set of sampled values at the falling edge of $t_{CK1N}$.

Note that if the system supports the extended range of reference clock frequencies F/1, F/2, F/4, F/8, F/16, F/32 and F/64 that the circuitry of FIG. 2B becomes slightly more complex, with an extended chain of delay elements 202, additional instances of logic gates 206-208, and a multiplexer to select between these instances. Delay matching for CK1 is also extended so as to match any latency in generating CK2.

Compensating for ISI

Figure 5A:
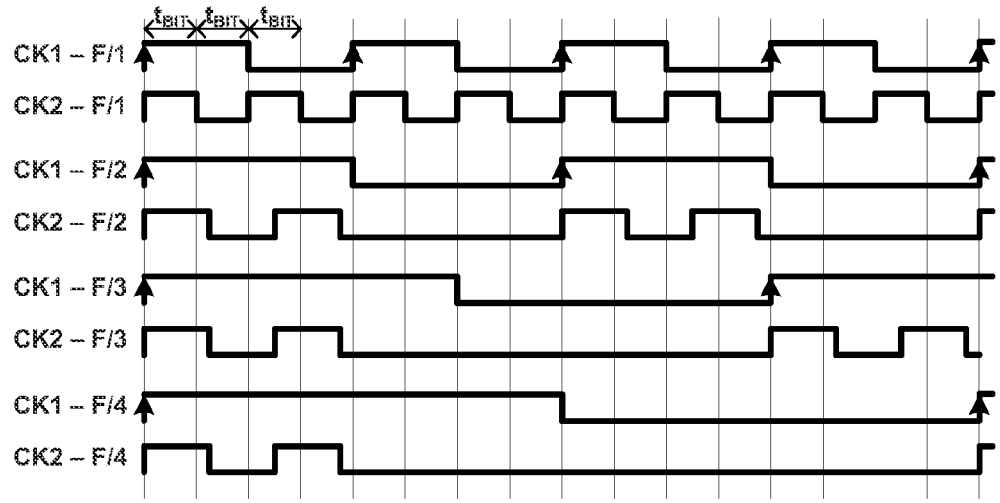
FIG. 5A presents a timing diagram illustrating how bit times can be nominally increased to reduce inter-symbol interference (ISI) when the reference clock frequency is reduced in accordance with the disclosed embodiments.

As mentioned above, when the reference clock frequency changes, the interval between bursts of timing events changes, and this change can potentially cause a slight increase in ISI, for example due to different transmission line reflections caused by the frequency change. To compensate for this potential increase in ISI, some of the disclosed embodiments nominally increase the bit time when the frequency of the reference timing signal decreases. This provides additional timing margin to deal with potential ISI problems. For example, FIG. 5A illustrates how the bit time $t_{BIT}$ can be lengthened whenever the reference clock frequency is less than F/1. Note that the resulting bursts, which comprise two clock cycles, lengthen to provide more timing margin for potential ISI problems.

Figure 5B:
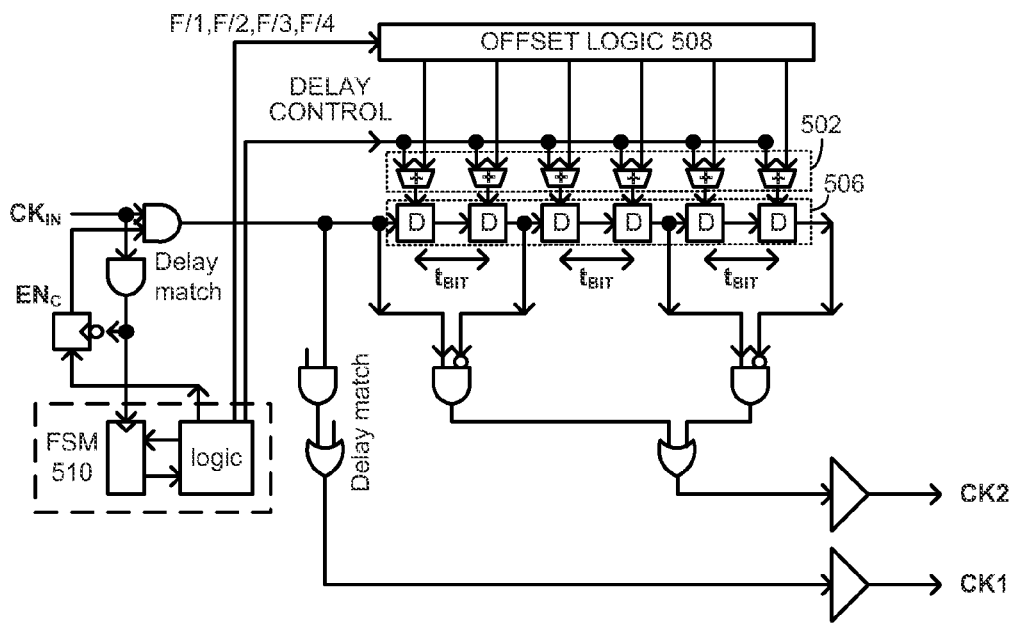
FIG. 5B illustrates a circuit associated with nominal increase in bit times in accordance with the disclosed embodiments.

Circuitry which implements this bit time lengthening is illustrated in FIG. 5B. Note that the clock multiplying circuit illustrated in FIG. 5B is the same as the clock multiplying circuitry illustrated in FIG. 2B, except that the circuit includes additional adders 502, which add a small constant value to the delay values produced by offset logic 508, and these increased delay values increase the delay times through delay elements 506. This small constant value is generated by control logic associated with finite state machine (FSM) 510. Making the small constant value larger provides more time to allow ISI problems to dissipate before a subsequent clock edge samples the next data value. The optimal size of this small constant value can be determined empirically by increasing the small constant value and observing the effect of the increase on error rate. When the error rate fall within an acceptable range, the small constant value does not have to be increased further.

In one implementation, the adjustment made to the delay times is only made once, as the clock falls below (or conversely rises above) F/1, using a constant value. The amount of adjustment is relatively small relative to a single period of signal CK1 at F/1, i.e., it is typically a constant of less than 10% of this period and thus does not represent a significant change in a bit time of signal CK2, which is substantially invariant for all supported frequencies of signal CK1.

Process of Generating a Multiplied Clock Frequency

Figure 6A:
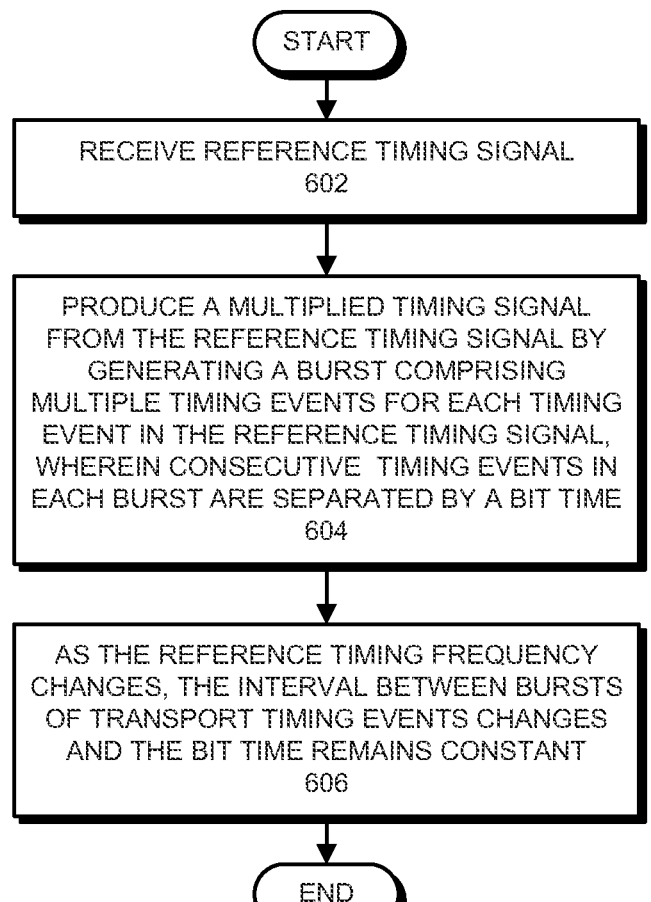
FIG. 6A presents a flow chart illustrating how a multiplied timing signal is produced in accordance with the disclosed embodiments.

FIG. 6A presents a flow chart illustrating how a multiplied timing signal is produced in accordance with the disclosed embodiments. First, the system receives a reference timing signal (step 602). Next, the system produces a multiplied timing signal from the reference timing signal by generating a burst comprising multiple timing events for each timing event in the reference timing signal, wherein consecutive timing events in each burst of timing events are separated by a bit time (step 604). Then, as the reference clock frequency changes, the interval between bursts of timing events changes while the bit time remains substantially constant (step 606).

Figure 6B:
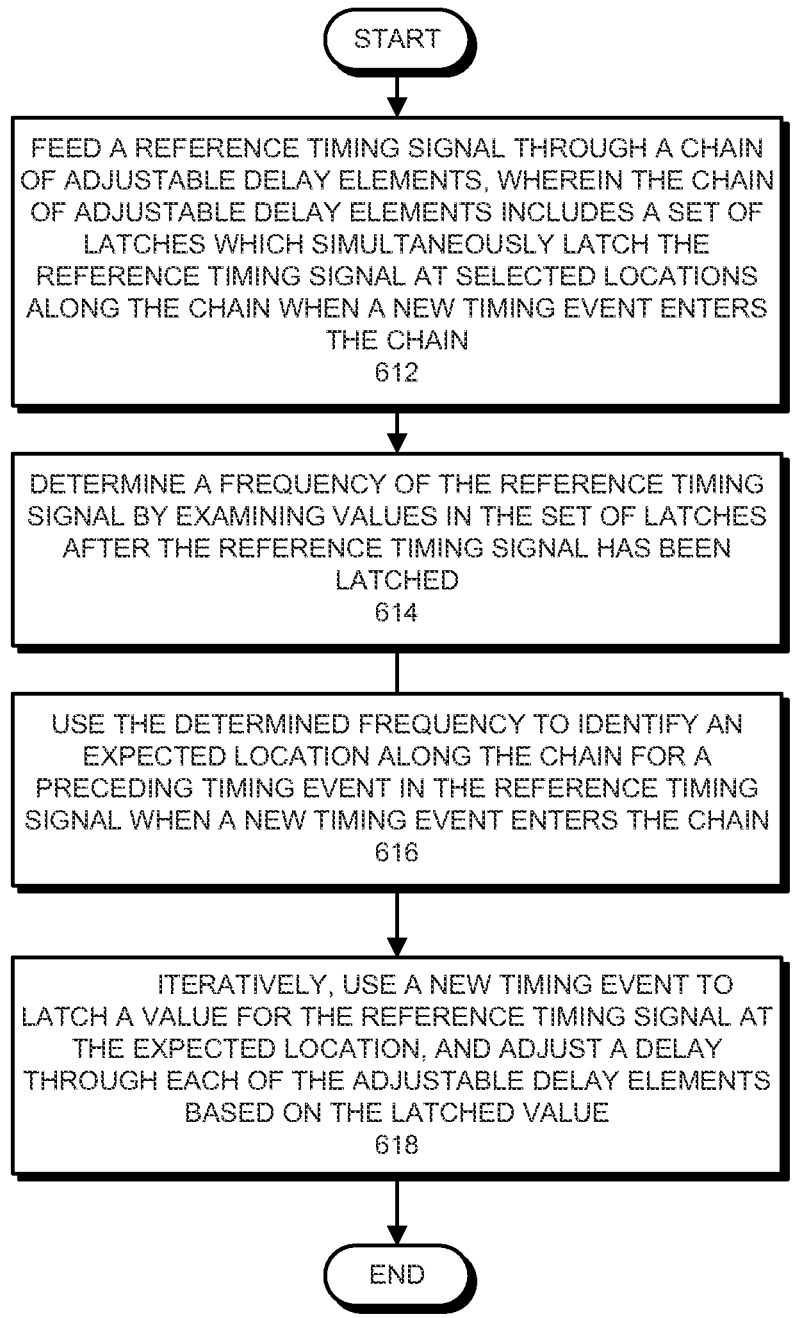
FIG. 6B presents a flow chart illustrating how delay elements are calibrated in accordance with the disclosed embodiments.

FIG. 6B presents a flow chart illustrating how delay elements are calibrated in accordance with the disclosed embodiments. First, the system feeds a reference timing signal through a chain of adjustable delay elements (step 612). The chain of adjustable delay elements can include a set of latches which simultaneously latch the reference timing signal at selected locations along the chain. Next, the system determines a frequency of the reference timing signal by examining values in the set of latches after the reference timing signal has been latched (step 614). Then, the system uses the determined frequency to identify an expected location along the chain for a preceding timing event in the reference timing signal when a new timing event enters the chain (step 616). Finally, the system calibrates the delay elements by iteratively (1) using a new timing event to latch a value for the reference timing signal at the expected location, and (2) adjusting a delay through each of the adjustable delay elements based on the latched value (step 618).

Delay Element

Figure 7:
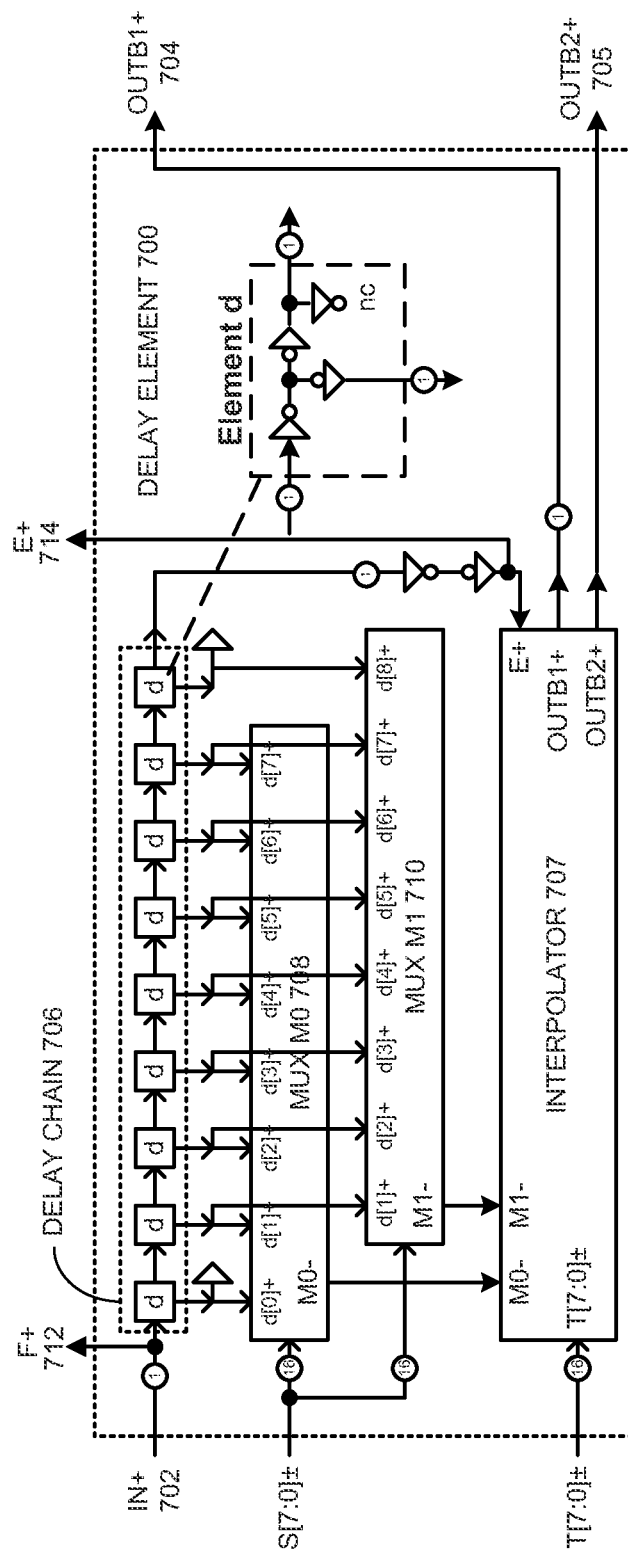
FIG. 7 illustrates the internal structure of a delay element in accordance with the disclosed embodiments.

FIG. 7 illustrates the internal structure of a digitally controlled delay element 700 in accordance with the disclosed embodiments. The goal of delay element 700 is to produce an overall delay (from IN+ 702 to OUTB1+ 704 nodes) that matches the $t_D$ parameter (one-half the bit time interval $t_{BIT}$), which in this example is about 0.3 ns. As illustrated in FIG. 7, delay element 700 receives an input IN+ 702 and produces outputs two OUTB1+ 704 and OUTB2+ 705. These two equivalent outputs are provided so one can be used to drive the input of a subsequent delay element and the other can be used to provide a buffered copy of the delay element's output; the latter copy can be used to drive other logic without disturbing the accuracy of the delay that is produced. Delay element 700 also includes a delay chain 706 coupled to input IN+ 702. The delay chain comprises inverter pairs which include a set of taps for selecting signals between the inverter pairs. Delay element 700 also includes two multiplexers (MUXes), including MUX M0 708 and MUX M1 710. MUX M0 708 is coupled to the set of taps and selects an "early signal" from a given tap in the delay chain. MUX M1 710 is also coupled to the set of taps and selects an associated "late signal" from a following tap in the delay chain, wherein the following tap immediately follows the given tap in the delay chain. Note that the delay chain taps are given equivalent loads, including the dummy buffer loads attached to the d[0] and d[8] output signals which couple to just one multiplexer input instead of two multiplexer inputs as the d[1] through d[7] output signals do.

Delay element 700 also includes an interpolator 707 which interpolates between the early signal and the late signal. The interpolator includes a plurality of current paths that selectively couple either the early signal or the late signal to the output. Note that adjusting interpolator 707 involves adjusting a number of current paths which are coupled to the early signal and a number of current paths which are coupled to the late signal. The control signals T[7:0] provide a thermometer code which specifies how may current paths are coupled to the early signal and how many are coupled to the late signal. If all of the current paths are coupled to the early signal, the output of the interpolator is simply the early signal. Similarly, if all of the current paths are coupled to the late signal, the output of the interpolator is simply the late signal. On the other hand, if some of the current paths are coupled to the early signal and some of the current paths are coupled to the late signal, the output of the interpolator is between the early signal and the late signal, and the thermometer code in T[7:0] can be used to adjust where the output of the interpolator falls between the early signal and the late signal. The operations of these current paths is described in more detail below with reference to FIG. 9A.

Figure 8:
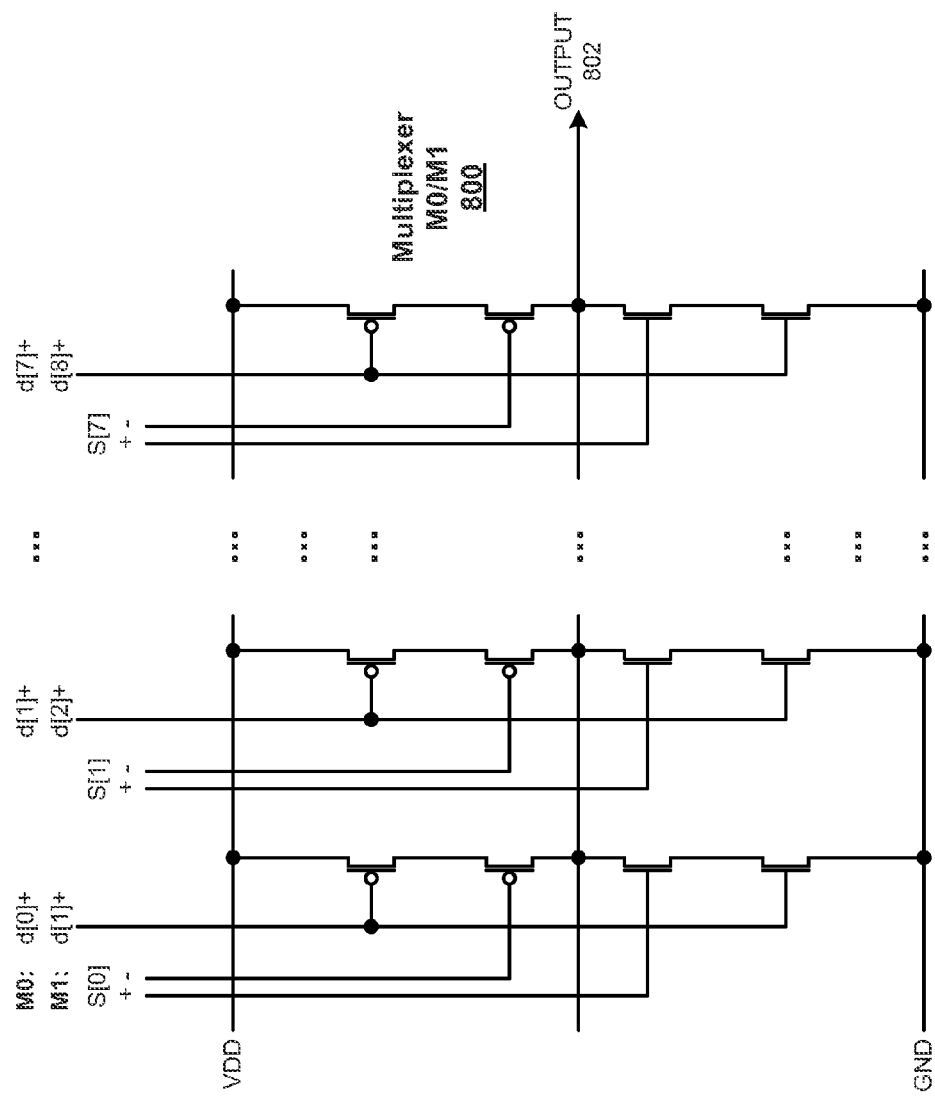
FIG. 8 illustrates the internal structure of a multiplexer in accordance with the disclosed embodiments.

FIG. 8 illustrates the internal structure of a multiplexer 800, such as multiplexers 708 and 710, in accordance with the disclosed embodiments. MUX M0 800 receives eight select signals S[0]-S[7] and eight data inputs. For MUX 708, the eight data inputs are d[0 ]+ to d[7]+, and for MUX M1 710, the eight data inputs are d[1]+ to d[8]+. The select signals S[0] to S[7] are "one hot" which means that only one of the select signals is asserted and the rest are not asserted. When a specific select signal is asserted, the associated data signal pulls the output 802 either to $V_{DD}$ or ground. Note that multiplexer 800 implements a conventional CMOS circuit topology, in which the output (in the steady state) is pulled high through active PMOS devices, or pulled low through active NMOS devices.

Figure 9A:
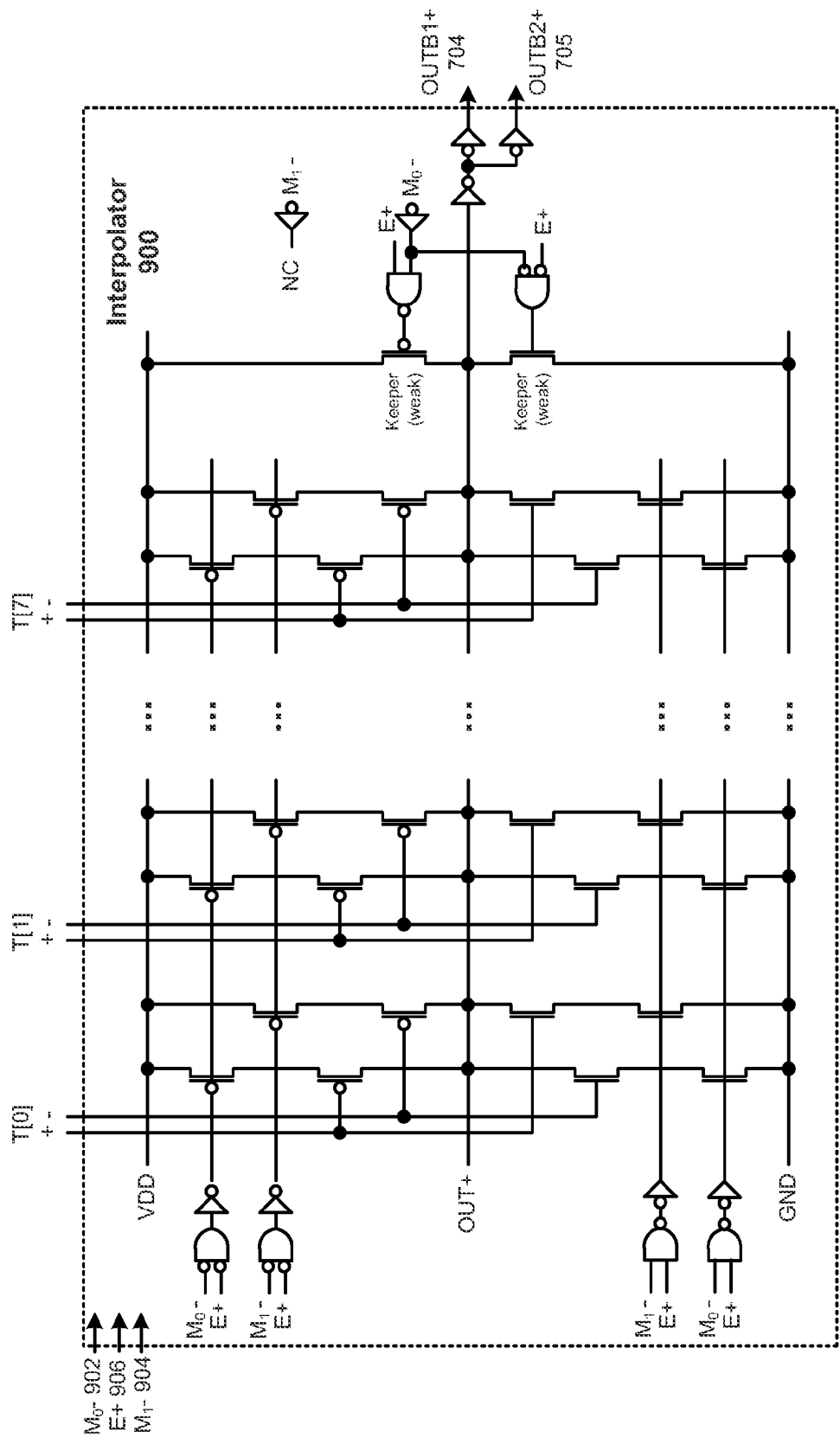
FIG. 9A illustrates the internal structure of an interpolator in accordance with the disclosed embodiments.

FIG. 9A illustrates the internal structure of an interpolator 900 in accordance with the disclosed embodiments. Interpolator 900 allows delay element 700 to provide 8 incremental delay settings between early signal $M_{0\_}$ 902 and late signal $M_{1\_}$ 904. This enables delay element 700 to provide finer resolution than what can be provided by a signal delay element in delay chain 706. More specifically, interpolator 900 receives as inputs: (1) early signal $M_{0\_}$ 902, (2) late signal $M_{1\_}$ 904, and (2) an enable signal E+ 906. Interpolator 900 uses these inputs to produce two outputs OUTB1+ 704 and OUTB2+ 705, which carry the same signal. OUTB1+ 704 feeds to a next delay element in a chain of delay elements, whereas OUTB2+ 705 provides a tap that can be used to sample the output signal from the delay element. Interpolator 900 also receives eight control values T[0]-T[7], wherein the eight control values T[0]-T[7] which provide a thermometer code identifying the number of current paths that couple the output to the early signal or the late signal.

During operation of interpolator circuit 900, the enable signal E+ 906 shuts off either the NMOS transistors or the PMOS transistors, wherein the NMOS transistors are shut off during rising edge transitions and the PMOS transistors are shut off during the falling edge transitions. This helps to prevent the NMOS transistors and the PMOS transistors from interfering with each other during these transitions. Interpolator 900 also includes a weak "keeper" circuit which maintains the output of interpolator 900 at either $V_{DD}$ or ground. This keeper circuit ensures that the output of the interpolator does spuriously switch multiple times during a rising or falling edge transition for the output signal.

Figure 9B:
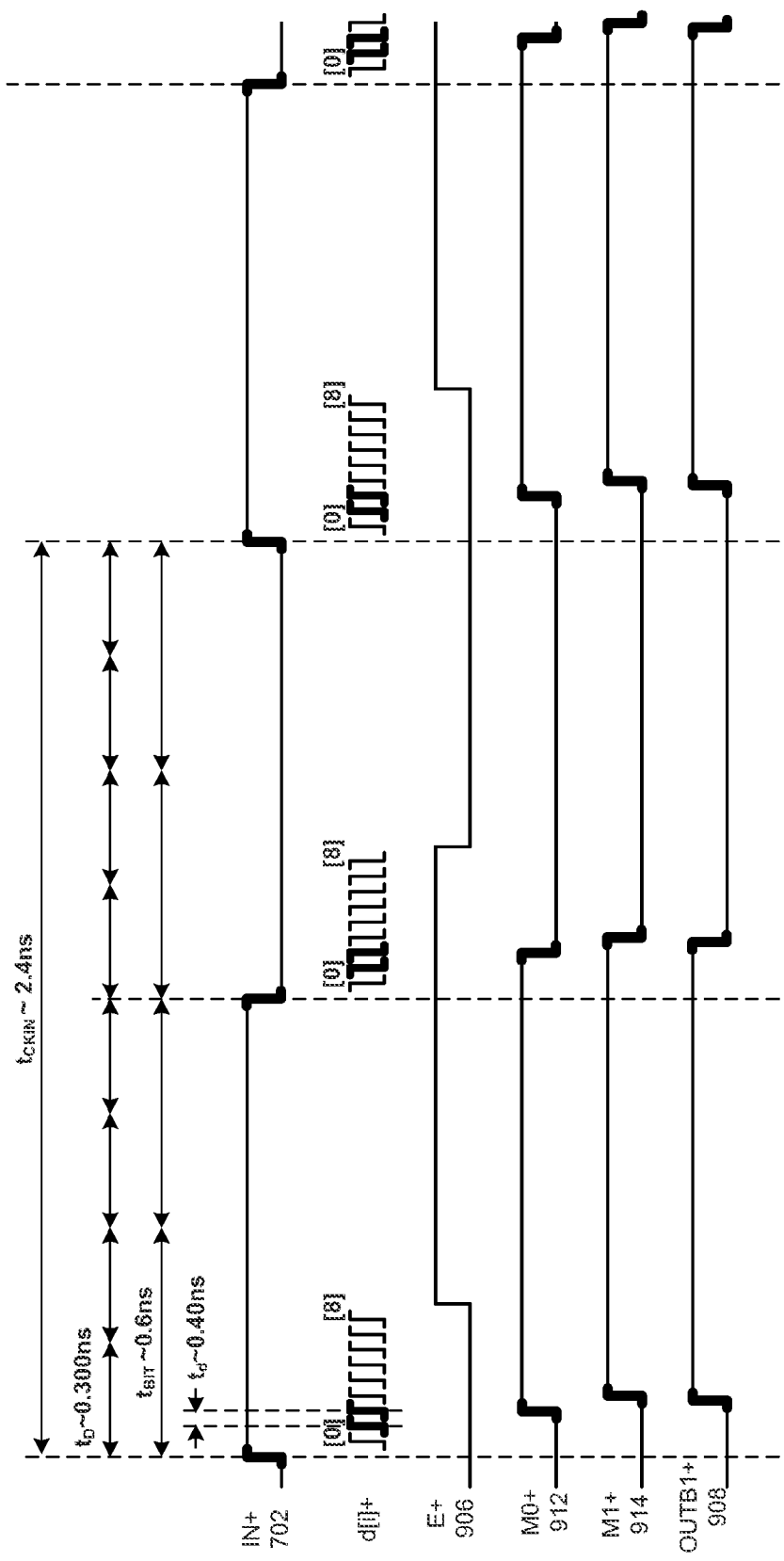
FIG. 9B illustrates a timing diagram for an interpolator in accordance with the disclosed embodiments.

FIG. 9B presents a timing diagram for interpolator circuit 900 in accordance with the disclosed embodiments. As can be seen in the timing diagram in FIG. 9B and in associated FIG. 7, input signal IN+ 702 feeds through delay chain 706, and the multiplexers 708 and 710 select an early signal M0+ 912 and a late signal M1+ 914. In this example, the early signal is from the d[1] delay element (inverter pair) and the late signal is from the d[2] delay element. These early and late signals feed through interpolator 706 to produce an output signal OUTB1+ 704. Note that enable signal E+ 906 is low during the rising edge transition, which shuts off the NMOS transistors and activates the PMOS transistors in interpolator 707. Conversely, enable signal E+ 906 is high during the subsequent falling edge transition, which shuts off the PMOS transistors and activates the NMOS transistors in interpolator 707. This prevents the pull-up interpolation and the pull-down interpolation circuits from interfering with each other by preventing the corresponding PMOS and NMOS transistors from sourcing and sinking current at the same time.

Figure 10A:
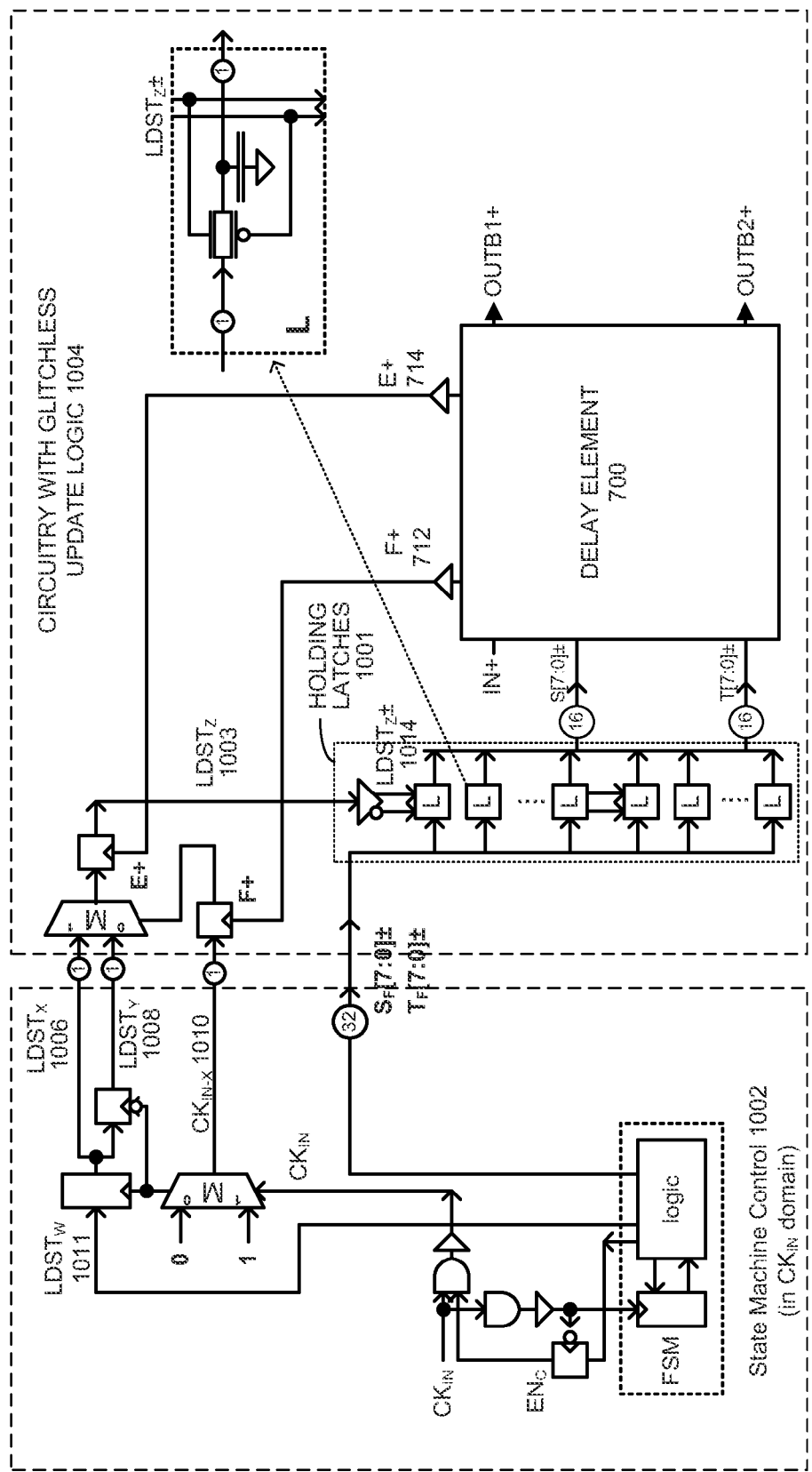
FIG. 10A illustrates updating circuitry for a delay element which provides a glitch-less update in accordance with the disclosed embodiments.
Figure 10B:
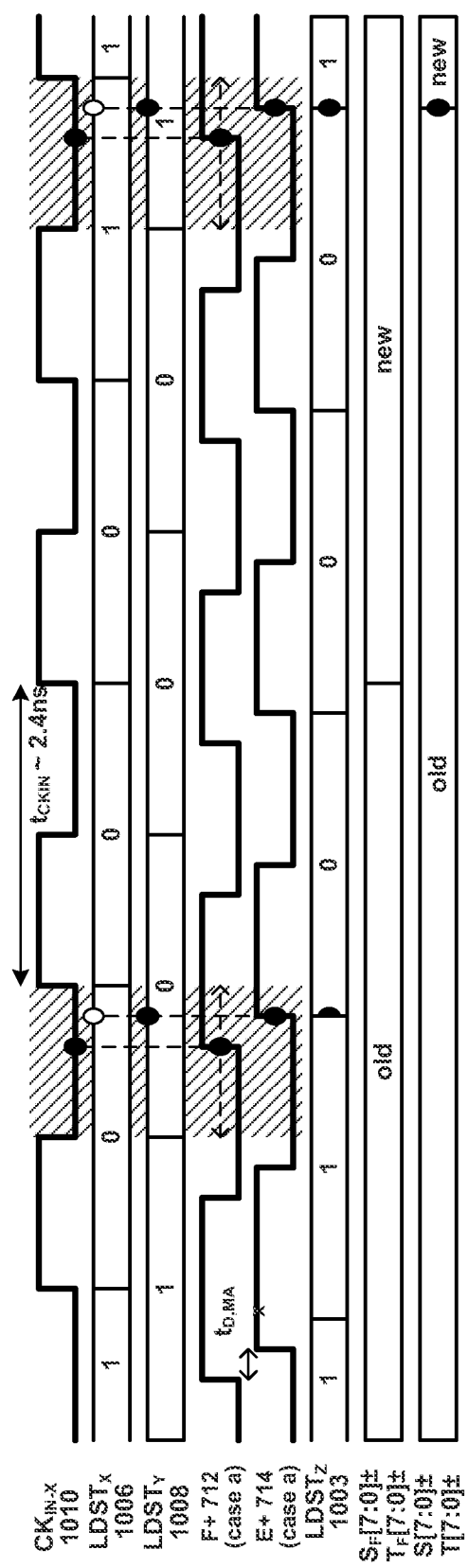
FIG. 10B illustrates a timing diagram for the updating circuitry in accordance with the disclosed embodiments.

FIG. 10A illustrates updating circuitry for a delay element which provides a glitch-less update in accordance with the disclosed embodiments. In order to avoid glitches in the output of the delay element, the circuitry updates the control values S[7:0] and T[7:0] at specific times. To facilitate this glitch-less update, the delay element 700 illustrated in FIG. 10A is coupled to a set of dynamic holding latches 1001, which hold control values S[7:0] and T[7:0]. These holding latches only change values when the signal $LDST_Z$ 1003 is asserted. Note that $LDST_Z$ signal 1003 is generated from $LDST_X$ 1006, $LDST_Y$ 1008 and $CK_{IN-X}$ 1010 signals, each received from the illustrated state machine. The delay element 700 generates signals F+ 712 and E+ 714. Although FIG. 7 shows the F+ signal 712 being driven from the IN+ node, it is also possible to tap F+ signal 712 off the unused buffer from the d[0] signal from the first "d" element in delay chain 706; this will avoid impacting delay chain 706.

The circuitry illustrated in FIG. 10A ensures that holding latches 1001 only change values when it is safe to do so, without causing glitches. Note that glitches can potentially arise if an input signal transition passes through a delay element while the control values S[7:0] and T[7:0] for the delay element are changing. In this case, the input signal transition can potentially cause multiple output signal transitions from the delay element. The timing for the circuitry illustrated in FIG. 10A is illustrated in the timing diagram which appears in FIG. 10B. Note that the new values for S[7:0] and T[7:0] are latched only when $CK_{IN-X}$ 1010 is low and $LDST_X$ 1006, $LDST_Y$ 1008, F+ 712 and E+ 714 are all asserted. This is accomplished by the incremental logic added to delay element 700 (shown in the 1004 box), which allows the control values SF[7:0] and TF[7:0] to update the S[7:0] and T[7:0] at the earliest possible time, regardless of the relative timing of the IN+ 702/OUTB1+ 704 pulsing and the $CK_{IN}$ clock domain.

More specifically, in each delay element 700, the F+ signal 712 is used to sample the $CK_{IN-X}$ timing signal 1010. The sampled $CK_{IN-X}$ 1010 signal controls whether an extra half clock of delay is added to the $LDST_W$ signal 1011 (the $LDST_Y$ 1008 case) or no delay is added ($LDST_X$ 1006 case). The appropriate LDST value is loaded by the E+ signal 714, and is then used to produce the $LDST_Z$ signal 1014. $LDST_Z$, in turn, opens the holding latches 1001, allowing the updated control value to flow through to the delay element 700. This new control value will be used for the next edge that appears on IN+ 107. Note that this circuitry ensures that the control value will never change while an IN+ 702 edge is propagating through the delay element 700.

Figure 11:
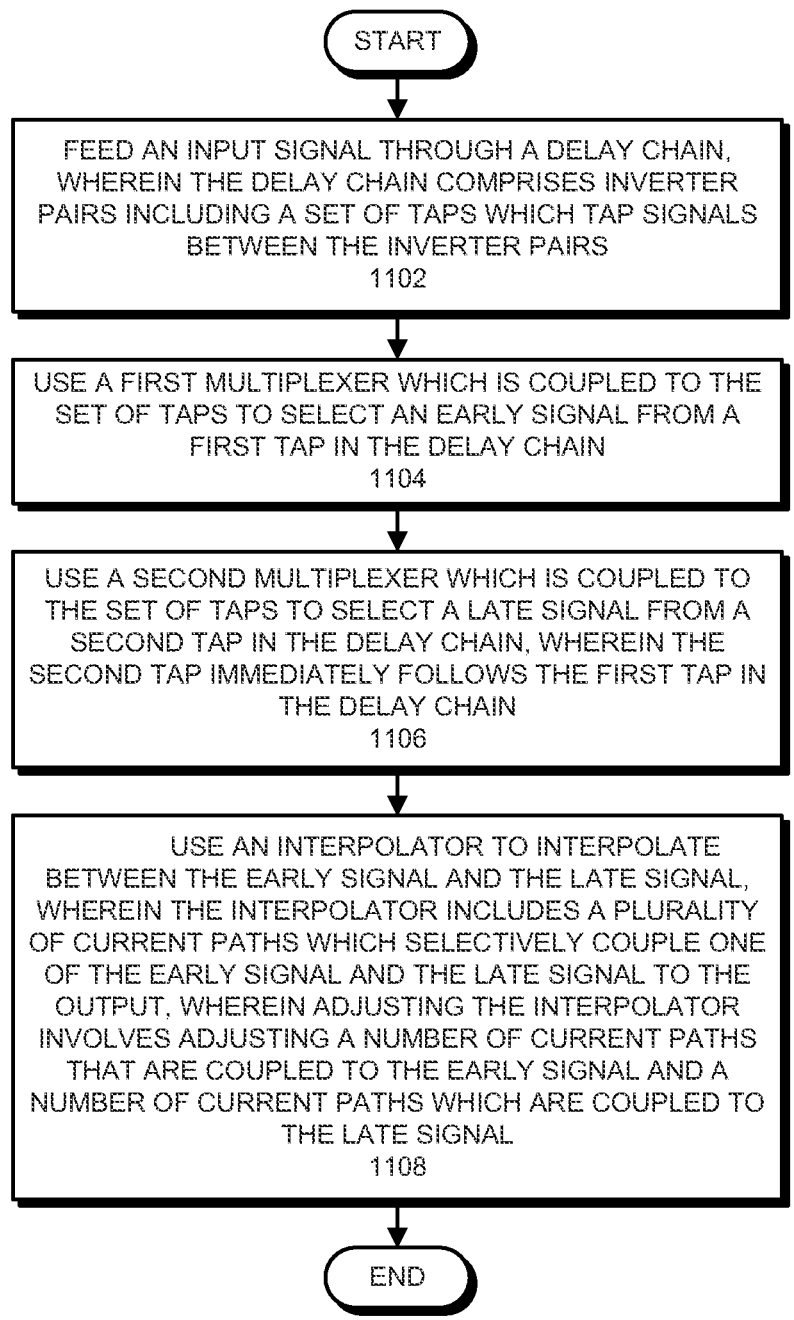
FIG. 11 presents a flow chart illustrating how a delay element operates in accordance with the disclosed embodiments.

FIG. 11 presents a flow chart illustrating how a delay element operates in accordance with the disclosed embodiments. First, the system feeds an input signal through a delay chain. The delay chain comprises inverter pairs including a set of taps which tap signals between the inverter pairs (step 1102). Next, the system uses a first multiplexer which is coupled to the set of taps to select an early signal from a first tap in the delay chain (step 1104). The system also uses a second multiplexer which is coupled to the set of taps to select a late signal from a second tap in the delay chain. The second tap immediately follows the first tap in the delay chain (step 1106). Finally, the system uses an interpolator to interpolate between the early signal and the late signal. The interpolator includes a plurality of current paths which selectively couple one of the early signal and the late signal to the output. The interpolator is adjusted using a number of current paths which are coupled to the early signal and a number of current paths which are coupled to the late signal.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in but are not limited to, application-specific integrated circuit (ASIC) chips, field-programmable gate arrays (FPGAs), and other programmable-logic devices.

What is claimed is:

1. An integrated circuit, comprising:
operational circuitry to operate at different rates responsive to respective reference clock frequencies;
a timing generation circuit to generate a timing signal in response to each one of plural repetitions of a reference clock timing event, wherein frequency of repetition of the reference clock timing event corresponds to a currently-used one of the different rates, the timing signal exhibiting a first timing component including a burst of periodic pulses, each pulse in the burst separated by a first time interval, the timing signal exhibiting a second time interval between adjacent bursts corresponding to the frequency of repetition of the reference clock timing event, wherein in response to a change in the reference clock frequency, the timing generation circuit varies the timing signal such that the first time interval and the burst of periodic pulses remain substantially invariant while the second time interval varies in a manner corresponding to the change in the reference clock frequency; and an interface to exchange data with another device at a data rate defined by the timing signal.

2. The integrated circuit of claim 1, where the integrated circuit transmits data to the another device, and where a strobe signal based on the timing signal is transmitted to the another device to provide source synchronous timing to the another device to time sample the data transmitted to the another device, and where the another device is a memory device and where:

the integrated circuit further comprises a memory controller;

the operational circuitry forms part of the memory controller, the operational circuitry being clocked according to a selective one of the respective reference clock frequencies; and the memory controller further comprises a transmitter and a receiver, each timed according to the timing signal, the memory controller to communicate bidirectionally with the memory device at a signaling rate that scales with the respective reference clock frequencies but maintains a substantially invariant bit time that corresponds to the first time interval within each burst.

3. The integrated circuit of claim 1, where:

the integrated circuit receives a reference clock signal having a frequency that is to vary, wherein different frequencies of the reference clock signal correspond to the different rates;

the timing generation circuit is to detect the frequency; and the integrated circuit further comprises a calibration circuit to calibrate the first time interval in a manner adjusted for the detected frequency, the first time interval being substantially invariant irrespective of the different rates.

4. The integrated circuit of claim 3, where the integrated circuit is to continue to apply a calibrated value for the first time interval notwithstanding change between the respective reference clock frequencies, and the interface is to continue to exchange data with the another device at the rate defined by the timing signal and the calibrated value, notwithstanding change between the respective reference clock frequencies.

5. The integrated circuit of claim 1, where the timing generation circuit comprises a chain of delay elements that sequentially receive a reference clock signal having a frequency that is to vary, wherein different frequencies of the reference clock signal correspond to the different rates, and where the timing signal is formed by a logical combination of signals from within the chain.

6. The integrated circuit of claim 5, where an amount of delay provided by the delay elements is adjustable.

7. The integrated circuit of claim 6, further comprising adjustment circuitry to adjust at least one spacing between the plural timing events by adjusting the amount of delay provided by the delay elements, the at least one spacing as adjusted being applied irrespective of changes between the reference clock frequencies.

8. The integrated circuit of claim 7, where the adjustment circuitry comprises a chain of the delay elements and a series of taps, and where a logical signal from the series of taps is to determine the amount of delay based on a comparison with the reference clock signal.

9. The integrated circuit of claim 8, further comprising a table to store ideal values for each of the taps in the series for each of the respective reference clock frequencies, the integrated circuit to compare an output of the series of taps with content of the table for the currently-used one of the different rates, and to responsively adjust delay provided by the delay elements.

10. The integrated circuit of claim 9, where the delay elements are each substantially identical to one another, and where delay provided by each delay element is to be adjusted responsive to the comparison between the output and the content of the table.

11. The integrated circuit of claim 1, further comprising adjustment circuitry to adjust at least one spacing between the plural timing events of the timing signal to compensate for drift, the at least one adjusted spacing being applied irrespective of changes between the reference clock frequencies.

12. A memory controller integrated circuit, comprising:

an input to receive a reference clock, the reference clock variable between at least two frequencies;

operational circuitry to operate at a rate defined by the reference clock;

a timing generation circuit to generate a timing signal from the reference clock, the timing signal, the timing signal generated in response to each repetition of a reference clock timing event, the timing signal exhibiting a first timing component including a burst of periodic pulses, each pulse in the burst separated by a first time interval, the timing signal exhibiting a second time interval between adjacent bursts corresponding to the frequency of repetition of the reference clock timing event, wherein in response to a change in the reference clock frequency, the timing generation circuit varies the timing signal such that the first time interval and the burst of periodic pulses remain substantially invariant while the second time interval varies corresponding to the change between the at least two frequencies; and an interface to exchange data with a memory device at a data rate defined by the timing signal.

13. The memory controller integrated circuit of claim 12, further comprising circuitry to calibrate the timing signal relative to the reference clock by adjusting at least one spacing between the timing events, the at least one spacing as adjusted to be applied irrespective of changes between the at least two frequencies.

14. A memory controller-implemented method, comprising:

receiving a reference clock signal exhibiting a first frequency;

generating a timing signal from the reference clock signal, the timing signal exhibiting a first timing component including a burst of periodic pulses, each pulse in the burst separated by a first timing interval, the timing signal exhibiting a second timing interval between adjacent bursts corresponding to the first frequency;

timing at least one of transmission of data to a memory device responsive to the timing signal or sampling of data from the memory device responsive to the timing signal;

where the reference clock signal is to vary between the first frequency and at least one other frequency, and where the timing signal varies in response to changes in the reference clock signal frequency such that the first time interval and the burst of periodic pulses remain substantially invariant, notwithstanding change of the reference clock signal between the at least two frequencies, and the second time interval varies with change of the reference clock signal between the first frequency and the at least one other frequency.

15. The memory controller-implemented method of claim 14, further comprising:
performing a calibration of the timing signal to adjust duration of the first time interval for drift, the calibration dependent on frequency of the reference clock signal; and
continuing to apply timing as adjusted by the calibration notwithstanding a change in the reference clock signal between the at least two frequencies.

16. The memory controller-implemented method of claim 14, where the reference clock signal is to change dynamically between the at least two frequencies during normal operation of the memory controller.

17. The memory controller-implemented method of claim 14, further comprising transmitting the timing signal to the memory device for the memory device to responsively time transmission of data to the memory controller.

* * * * *